(12) United States Patent
Lee et al.

(10) Patent No.: US 12,279,490 B2
(45) Date of Patent: Apr. 15, 2025

(54) DISPLAY DEVICE HAVING ELECTROSTATIC PROTECTION CIRCUIT

(71) Applicant: Samsung Display Co., Ltd., Yongin-si (KR)

(72) Inventors: Woo Geun Lee, Suwon-si (KR); Young Jae Jeon, Hwaseong-si (KR); Woo Bin Lee, Hwaseong-si (KR); Jin Won Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 646 days.

(21) Appl. No.: 17/465,795

(22) Filed: Sep. 2, 2021

(65) Prior Publication Data

US 2022/0157915 A1    May 19, 2022

(30) Foreign Application Priority Data

Nov. 17, 2020   (KR) .......................... 10-2020-0153498

(51) Int. Cl.
  *H10K 59/131* (2023.01)

(52) U.S. Cl.
  CPC ................. *H10K 59/131* (2023.02)

(58) Field of Classification Search
  CPC .................................................. H10K 59/131
  See application file for complete search history.

(56) References Cited

U.S. PATENT DOCUMENTS

| | | | |
|---|---|---|---|
| 9,195,106 B2 | 11/2015 | Koo | |
| 10,168,592 B2 | 1/2019 | Hong | |
| 2008/0079001 A1* | 4/2008 | Umezaki | G02F 1/136286 257/E27.111 |
| 2013/0062607 A1* | 3/2013 | Yamazaki | H01L 27/0266 257/E29.273 |
| 2018/0254351 A1* | 9/2018 | Jung | H10K 10/482 |
| 2019/0162985 A1 | 5/2019 | Kim | |
| 2019/0206899 A1* | 7/2019 | Takahashi | G09G 3/2092 |
| 2020/0144535 A1* | 5/2020 | Kim | H10K 59/122 |
| 2020/0365576 A1 | 11/2020 | Kim | |

FOREIGN PATENT DOCUMENTS

| | | |
|---|---|---|
| KR | 10-0612988 | 11/2006 |
| KR | 10-2008-0076196 | 8/2008 |
| KR | 10-2008-0100580 | 11/2008 |
| KR | 10-1468511 | 12/2014 |
| KR | 10-2017-0117263 | 10/2017 |
| KR | 10-2018-0051691 | 5/2018 |
| KR | 10-1950943 | 2/2019 |
| KR | 10-2019-0062656 | 6/2019 |
| KR | 10-2020-0087854 | 7/2020 |

* cited by examiner

Primary Examiner — Lex H Malsawma
Assistant Examiner — Sean Ayers Winters
(74) Attorney, Agent, or Firm — KILE PARK REED & HOUTTEMAN PLLC

(57) ABSTRACT

A display device including a substrate; a signal line disposed on the substrate and to which a predetermined voltage signal is applied; a power auxiliary line to which a first source voltage is applied; a first driving voltage line to which a first driving voltage higher than the first source voltage is applied; and a first transistor disposed between the signal line and the first driving voltage line. The first transistor includes a first lower gate electrode connected to the power auxiliary line and a first upper gate electrode connected to the signal line.

20 Claims, 13 Drawing Sheets

EMD: PXE, EML, CME
100: 110, 111, 112, 130, 113, 140, 161, 150, 162,
   PXE, PDL, EML, CME, 170
120: 121
130: 131a, 131b, 131c
140: 141
150: 151, 152

DISPLAY DEVICE HAVING ELECTROSTATIC PROTECTION CIRCUIT

CROSS-REFERENCE TO RELATED APPLICATION

This application claims priority from and the benefit of Korean Patent Application No. 10-2020-0153498, filed on Nov. 17, 2020, which is hereby incorporated by reference for all purposes as if fully set forth herein.

BACKGROUND

Field

Embodiments of the invention relate generally to a display device.

Discussion of the Background

The importance of display devices has steadily increased with the development of multimedia technology. In response thereto, various types of display devices, such as an organic light emitting display (OLED), a liquid crystal display (LCD) and the like, have been used. Such display devices have been variously applied to various mobile electronic devices, for example, portable electronic devices, such as a smart phone, a smart watch, and a tablet PC.

An electrostatic discharge (ESD) phenomenon may occur in the manufacturing process of a display device. Charges generated by static electricity may cause damage to a TFT transistor and an insulating layer, causing deterioration of a display panel included in the display device, thereby affecting the production yield. Accordingly, when designing a display device, circuits and elements for electrostatic discharge may be designed in a display panel.

The above information disclosed in this Background section is only for understanding of the background of the inventive concepts, and, therefore, it may contain information that does not constitute prior art.

SUMMARY

Embodiments of the invention provide a display device having improved reliability in which a threshold voltage of a transistor included in a protection circuit is increased to reduce a leakage current, thereby reducing noise generated in the display device.

Additional features of the inventive concepts will be set forth in the description which follows, and in part will be apparent from the description, or may be learned by practice of the inventive concepts.

An embodiment of the invention provides a display device including a substrate; a signal line disposed on the substrate and to which a predetermined voltage signal is applied; a power auxiliary line to which a first source voltage is applied; a first driving voltage line to which a first driving voltage higher than the first source voltage is applied; and a first transistor disposed between the signal line and the first driving voltage line. The first transistor includes a first lower gate electrode connected to the power auxiliary line and a first upper gate electrode connected to the signal line.

Another embodiment of the invention provides a display device including a substrate; a signal line disposed on the substrate and to which a predetermined voltage signal is applied; a first driving voltage line to which a first driving voltage is applied; a second driving voltage line to which a second driving voltage lower than the first driving voltage is applied; a first transistor disposed between the signal line and the first driving voltage line and including a first lower gate electrode and a first upper gate electrode; and a second transistor disposed between the signal line and the second driving voltage line and including a second lower gate electrode and a second upper gate electrode. The same voltage is applied to the first lower gate electrode and the second lower gate electrode.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
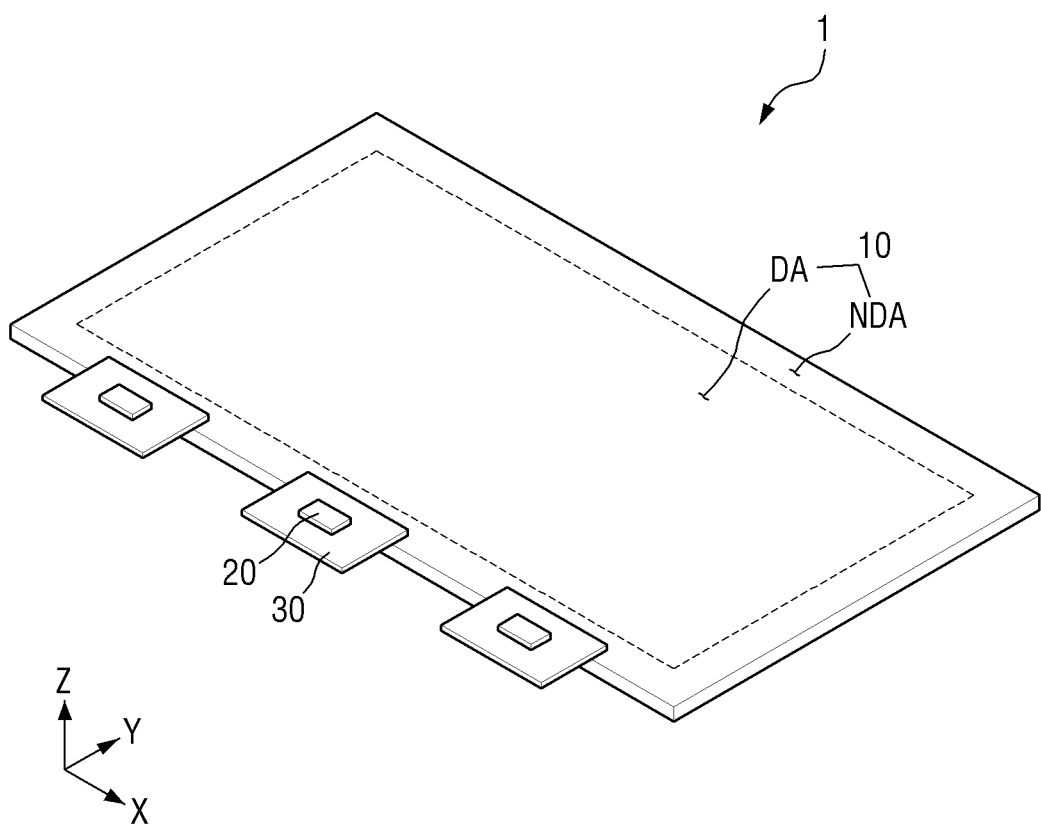
FIG. 1 is a perspective view of a display device according to an embodiment of the invention.

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular is embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings.

FIG. 1 is a perspective view of a display device according to an embodiment.

Referring to FIG. 1, a display device 1 is a device for displaying a moving image or a still image. The display device 1 may be used as a display screen of various devices, such as a television, a laptop computer, a monitor, a billboard and an Internet-of-Things (JOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 1 according to an embodiment includes a display panel 10, display driving circuits 20, and circuit boards 30.

The display panel 10 may be formed in a rectangular shape having long sides in a first direction X and short sides in a second direction Y crossing the first direction X. A corner where the long side in the first direction X and the short side in the second direction Y meet may be right-angled, but the inventive concepts are not limited thereto and the corner may be rounded to have a predetermined curvature. The planar shape of the display panel 10 is not limited to the rectangular shape, and may be formed in another polygonal shape, a circular shape, or an elliptical shape. One surface of the display panel 10 may include a flat surface, but is not limited thereto, and may include a curved portion having a constant curvature or a varying curvature. Alternatively, the display panel 10 may be formed to be flexible so that it can be curved, bent, folded, or rolled.

The display panel 10 may include a display area DA displaying an image and a non-display area NDA disposed around the display area DA. The display area DA may occupy most of the area of the display panel 10. The display area DA may be disposed at the center of the display panel 10. A plurality of pixels PX (see FIG. 2) may be arranged in the display area DA to display an image.

The non-display area NDA may be disposed adjacent to the display area DA. The non-display area NDA may be an area outside the display area DA. The non-display area NDA may be disposed to surround the display area DA. The non-display area NDA may be located at the edge of the display area DA.

The plurality of circuit boards 30 may be disposed in the non-display area NDA. Specifically, the plurality of circuit boards 30 may be disposed on one edge of the display panel 10. In FIG. 1, a display device 1 including three circuit boards 30 is illustrated, but the number of the circuit boards 30 is not limited thereto.

The display panel 10 may receive data signals, source voltages, and scan control signals through the circuit boards 30. The circuit boards 300 may each be a flexible printed circuit board, a printed circuit board, or a flexible film, such as a chip-on-film.

The display driving circuits 20 may generate the data signals and the scan control signals. The display driving circuits 20 may supply the data signals and the scan control signals to the display panel 10 through the circuit boards 30. Alternatively, the scan control signals may be generated by timing driving circuits other than the display driving circuits 20, and may be supplied to the display panel 10 through the circuit boards 30. The display driving circuit 20 may be formed as an integrated circuit (IC) and attached onto the circuit board 30.

Figure 2:
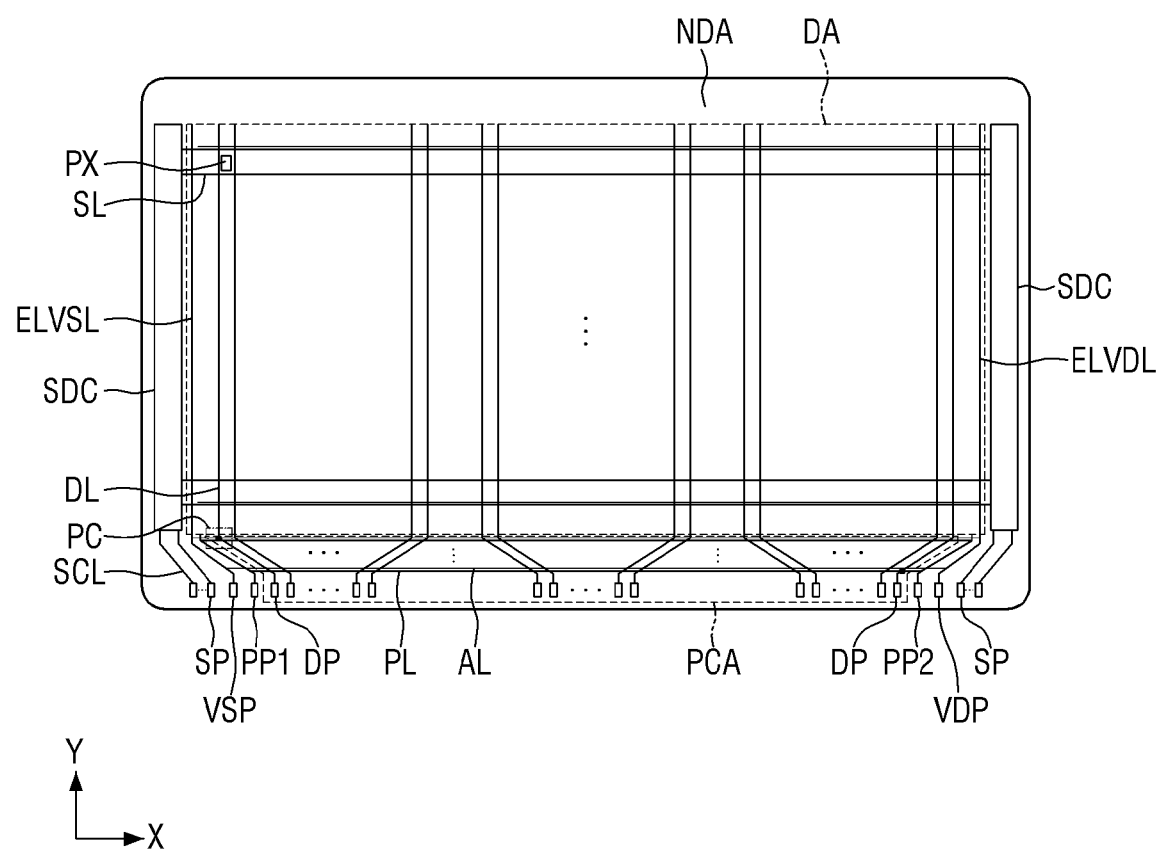
FIG. 2 is a layout diagram illustrating an example of a display panel of FIG. 1.

FIG. 2 is a layout diagram illustrating an example of a display panel of FIG. 1.

Referring to FIG. 2, the display panel 10 may include a plurality of pixels PX, a plurality of scan drivers SDC, a plurality of scan lines SL, a plurality of data lines DL, first and second power lines ELVDL and ELVSL, a plurality of driving voltage lines PL, a plurality of power auxiliary lines AL, a plurality of display pads DP, a plurality of scan pads SP, first and second power pads VDP and VSP, and first and second protection pads PP1 and PP2.

In the display area DA of the display panel 10, the plurality of pixels PX, the plurality of scan lines SL, the plurality of data lines DL, and the first and second power lines ELVDL and ELVSL may be disposed.

The plurality of scan lines SL may extend in the first direction X and may be arranged in the second direction Y. The scan line SL may be connected to the scan driver SDC, and a scan signal provided from the scan driver SDC may be applied to the scan line SL.

The plurality of data lines DL may extend in the second direction Y and may be arranged in the first direction X. Each data line DL may be connected to the display pad DP and electrically connected to the display driving circuit 20 of the circuit board 30 through the display pad DP. A data signal provided from the display driving circuit 20 may be applied to the data line DL.

The plurality of pixels PX may be arranged in the first direction X and the second direction Y. That is, the plurality of pixels PX may be arranged in a matrix form. The specific structure of each pixel PX will be described later.

In the non-display area NDA of the display panel 10, the plurality of scan drivers SDC, a plurality of scan control lines SCL, the plurality of driving voltage lines PL, the plurality of power auxiliary lines AL, the plurality of display pads DP, the plurality of scan pads SP, the first and second power pads VDP and VSP, and the first and second protection pads PP1 and PP2 may be disposed.

The scan driver SDC may be connected to the scan pad SP through the scan control line SCL. Thus, the scan driver SDC may be electrically connected to the circuit board 30 through the scan pad SP. A scan control signal provided from the circuit board 30 may be applied to the scan driver SDC. The scan driver SDC may generate a scan signal according to the scan control signal and supply it to the scan line SL.

FIG. 2 illustrates that the scan driver SDC is disposed in the non-display area NDA at the left outer side and the right outer side of the display area DA, but its location is not limited thereto. For example, the scan driver SDC may be disposed in the non-display area NDA at the left outer side of the display area DA or the non-display area NDA at the right outer side of the display area DA.

The plurality of display pads DP, the plurality of scan pads SP, the first and second power pads VDP and VSP, and the first and second protection pads PP1 and PP2 may be disposed in the non-display area NDA at the lower outer side of the display area DA.

The non-display area NDA may include an electrostatic protection circuit area PCA in which an electrostatic protection circuit PC is disposed. In an embodiment, the electrostatic protection circuit PC may be disposed for each data line DL disposed in the non-display area NDA. The electrostatic protection circuit area PCA may include an area in which the plurality of display pads DP and the data lines DL respectively extending from the display pads DP are disposed in the non-display area NDA. A detailed description of the electrostatic protection circuit PC will be described later.

The first and second protection pads PP1 and PP2 may be disposed at the outer side of the plurality of display pads DP. For example, the first protection pad PP1 may be disposed to the left of the plurality of display pads DP, and the second protection pad PP2 may be disposed to the right of the plurality of display pads DP. The driving voltage line PL extending in the first direction X may be connected to the first and second protection pads PP1 and PP2.

The second power pad VSP may be disposed to the left of the first protection pad PP1, and the first power pad VDP may be disposed to the right of the second protection pad PP2. The first power line ELVDL extending from the first power pad VDP in the second direction Y may be branched into a plurality of lines in the first direction X to be connected to a pixel electrode PXE (see FIG. 4) of each pixel PX. The second power line ELVSL extending from the second power pad VSP in the second direction Y may be electrically connected to a common electrode CME (see FIG. 4) to be described later.

The plurality of power auxiliary lines AL may be connected to the second power line ELVSL. Each power auxiliary line AL may be branched from the second power line ELVSL and extend in the first direction X. Each power auxiliary line AL may cross the data line DL extending in the second direction Y.

Figure 3:
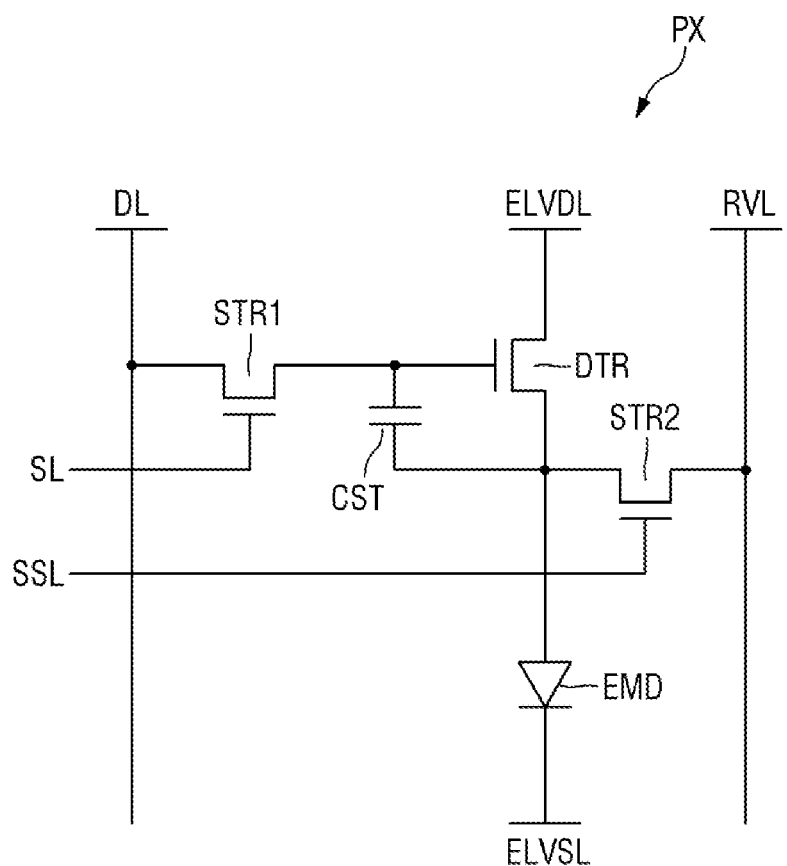
FIG. 3 is an equivalent circuit diagram of one pixel of a display device according to an embodiment of the invention.

FIG. 3 is an equivalent circuit diagram of one pixel of a display device according to an embodiment.

Referring to FIG. 3, each pixel PX of the display device 1 according to an embodiment includes three transistors DTR, STR1, and STR2 and one storage capacitor CST in addition to a light emitting element EMD.

The light emitting element EMD emits light according to a current supplied through a driving transistor DTR. The light emitting element EMD may be implemented as an organic light emitting diode, a micro light emitting diode, a nano light emitting diode, or the like.

A first electrode (i.e., anode electrode) of the light emitting element EMD is connected to a source electrode of the driving transistor DTR, and a second electrode (i.e., cathode electrode) of the light emitting element EMD is connected to a second power line ELVSL to which a low potential voltage (second source voltage) lower than a high potential voltage (first source voltage) of the first power line ELVDL is supplied.

The driving transistor DTR adjusts a current flowing from the first power line ELVDL, to which the first source voltage is applied, to the light emitting element EMD according to a voltage difference between a gate electrode and the source electrode. The gate electrode of the driving transistor DTR may be connected to a first source/drain electrode of the first switching transistor STR1, the source electrode of the driving transistor DTR may be connected to the first electrode of the light emitting element EMD, and a drain electrode of the driving transistor DTR may be connected the first power line ELVDL to which the first source voltage is applied.

The first switching transistor STR1 is turned on by a scan signal applied from the scan line SL to connect the data line DL to the gate electrode of the driving transistor DTR. The gate electrode of the first switching transistor STR1 may be connected to the scan line SL, the first source/drain electrode thereof may be connected to the gate electrode of the driving transistor DTR, and the second source/drain electrode thereof may be connected to the data line DL.

The second switching transistor STR2 is turned on by a sensing signal applied from the sensing signal line SSL to connect the reference voltage line RVL to the source electrode of the driving transistor DTR. The gate electrode of the second switching transistor STR2 may be connected to the sensing signal line SSL, the first source/drain electrode thereof may be connected to the reference voltage line RVL, and the second source/drain electrode thereof may be connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode. However, the inventive concepts are not limited thereto, and the opposite case may be applied.

The storage capacitor CST is formed between the gate electrode and the source electrode of the driving transistor DTR. The storage capacitor CST may store a difference voltage between a gate voltage and a source voltage of the driving transistor DTR.

The driving transistor DTR, the first switching transistor STR1, and the second switching transistor STR2 may be formed as thin film transistors. The driving transistor DTR and the first and second switching transistors STR1 and STR2 may be formed of N-type metal oxide semiconductor field effect transistors (MOSFETs), but are not limited thereto, and may be formed of P-type MOSFETs, or alternatively, some may be formed of N-type MOSFETs and the others may be formed of P-type MOSFETs.

Figure 4:
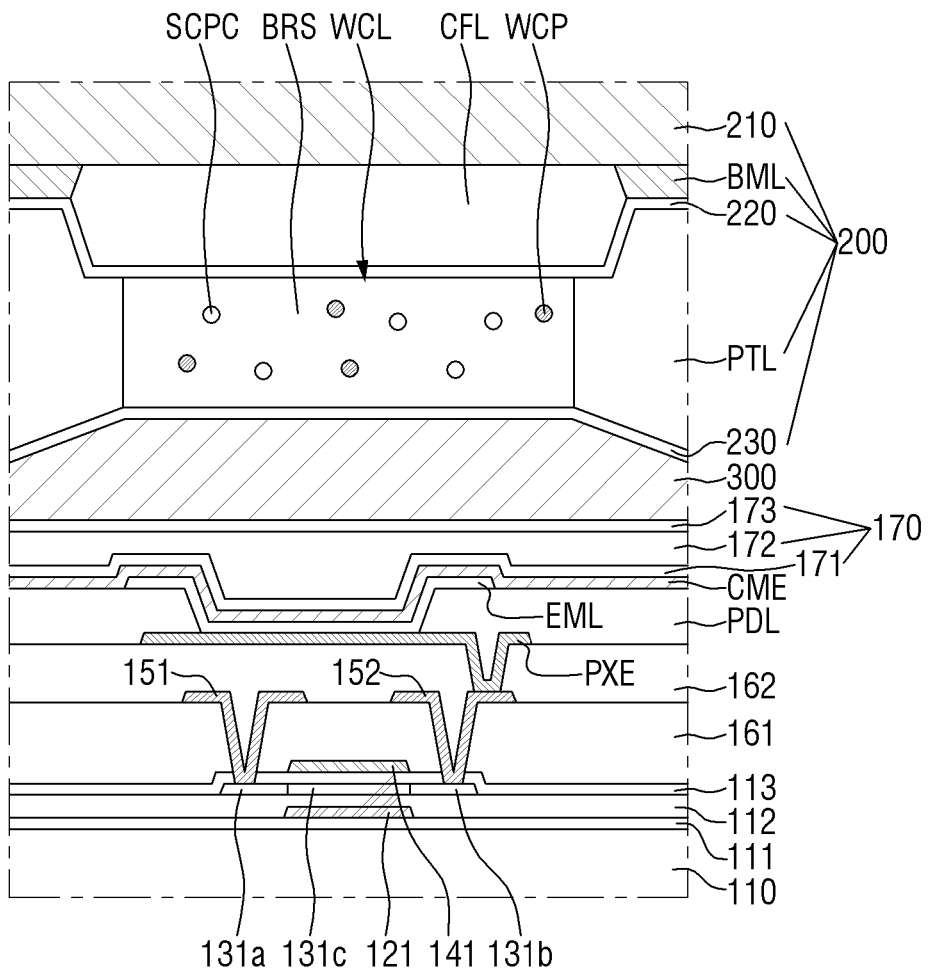
FIG. 4 is a cross-sectional view of one pixel of a display device according to an embodiment of the invention.

FIG. 4 is a cross-sectional view of one pixel of a display device according to an embodiment.

Referring to FIG. 4, a top emission type display device that emits light L not in a direction toward a first base substrate 110 on which a light emitting layer EML is formed, but in its opposite direction (a direction toward a second base substrate 210) is illustrated in FIG. 4. However, the inventive concepts are not limited thereto, and the display device 1 may be a bottom emission type or a double-sided emission type display device.

The display device 1 may include a first display substrate 100, a second display substrate 200 facing the first display substrate 100, and a filling layer 300 bonding them.

The first display substrate 100 may include the base substrate 110, a barrier layer 111, a buffer layer 112, a semiconductor layer 130, a gate insulating layer 113, a second conductive layer 140, and an interlayer insulating layer 161, a third conductive layer 150, a via layer 162, the pixel electrode PXE, a pixel defining layer PDL, the light emitting layer EML, the common electrode CME, and a thin film encapsulation layer 170, which are sequentially disposed. Each of the layers described above may consist of a single layer, or a stack of multiple layers. Other layers may be further disposed between the layers.

The base substrate 110 supports the respective layers disposed thereon. The base substrate 110 may be made of, for example, an insulating material, such as a polymer resin. Without being limited thereto, the base substrate 110 may include a metal material.

The base substrate 110 may be a flexible substrate which can be bent, folded, or rolled. The material of the flexible substrate may be polyimide (PI), but the inventive concepts are not limited thereto.

A transparent substrate may be used when the organic light emitting display device is a bottom emission type or a double-sided emission type. When the organic light emitting display device is a top emission type, in addition to a transparent substrate, a translucent or opaque substrate may be applied.

The barrier layer 111 may be disposed on the base substrate 110. The barrier layer 111 may prevent diffusion of impurity ions, prevent permeation of moisture or external air, and perform a surface planarization function. The barrier layer 111 may include silicon nitride, silicon oxide, silicon oxynitride, or the like. The barrier layer 111 may be omitted depending on the type of the base substrate 110, process conditions, and the like.

A first conductive layer 120 may be disposed on the barrier layer 111. The first conductive layer 120 may include a light blocking pattern 121. The light blocking pattern 121 may block irradiation of external light to a channel region 131c of a semiconductor pattern 131a, 131b, and 131c to be described later, thereby preventing a photocurrent from flowing through the channel region 131c.

The buffer layer 112 may be disposed on the first conductive layer 120. The buffer layer 112 may include at least one of silicon nitride, silicon oxide, or silicon oxynitride. The buffer layer 112 may be omitted depending on the type of the base substrate 110, process conditions, and the like.

The semiconductor layer 130 may be disposed on the buffer layer 112. The semiconductor layer 130 may include the semiconductor pattern 131a, 131b, and 131c.

The semiconductor pattern 131a, 131b, and 131c may include the channel region 131c overlapping in a thickness direction a gate electrode 141 disposed thereabove, and a first source/drain region 131a and a second source/drain region 131b respectively disposed to one side and the other side of the channel region 131c. The first and second source/drain regions 131a and 131b may include a plurality of carrier ions and may have a high conductivity and low electric resistance in comparison with the channel region 131c. The semiconductor layer 130 may be made of polycrystalline silicon, monocrystalline silicon, amorphous silicon, or the like.

The gate insulating layer 113 may be disposed on the semiconductor layer 130. The gate insulating layer 113 may be disposed substantially over the entire surface of the base substrate 110. The gate insulating layer 113 may include a silicon compound, a metal oxide, or the like. For example, the gate insulating layer 113 may include silicon oxide, silicon nitride, silicon oxynitride, aluminum oxide, tantalum oxide, hafnium oxide, zirconium oxide, titanium oxide, or the like. These materials may be used alone or in combination with each other.

The second conductive layer 140 may be disposed on the gate insulating layer 113. The second conductive layer 140 is a gate conductive layer and may include the gate electrode 141. The second conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The interlayer insulating layer 161 may be disposed on the second conductive layer 140. The interlayer insulating layer 161 may include a silicon compound, a metal oxide, or the like. For example, the interlayer insulating layer 161 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 150 may be disposed on the interlayer insulating layer 161. The third conductive layer 150 is a data conductive layer and may include the data line DL for applying a data signal. The third conductive layer 150 may include a first source/drain electrode 151 and a second source/drain electrode 152 of the driving transistor DTR.

The first source/drain electrode 151 may be electrically connected to the first source/drain region 131a of the semiconductor pattern 131a, 131b, and 131c through a contact hole penetrating the interlayer insulating layer 161 and the gate insulating layer 113.

The second source/drain electrode 152 may be electrically connected to the second source/drain region 131b of the semiconductor pattern 131a, 131b, and 131c through a is contact hole penetrating the interlayer insulating layer 161 and the gate insulating layer 113.

The third conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The via layer 162 may be disposed on the third conductive layer 150. The via layer 162 may be disposed on the third conductive layer 150 and may completely cover the top surface of the interlayer insulating layer 161. In the case where the via layer 162 is formed as an organic layer, the top surface thereof may be partially flat despite a lower step.

The via layer 162 may include an organic insulating material selected from the group consisting of acrylic resin, epoxy resin, phenolic resin, polyamide resin, polyimide resin, unsaturated polyester resin, polyphenylene resin, polyphenylenesulfide resin, and benzocyclobutene (BCB).

The pixel electrode PXE may be disposed on the via layer 162. The pixel electrode PXE may be an anode electrode. The pixel electrode PXE may be separately disposed for each pixel PX. The pixel electrode PXE may be electrically connected to the second source/drain electrode 152 through a contact hole penetrating the via layer 162.

The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer, such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but the inventive concepts are not limited thereto. The layer having a high work function may be disposed above the reflective material layer and disposed closer to the light emitting layer EML. The pixel electrode PXE may have a stacked structure of ITO/Mg, ITO/MgF, ITO/Ag, or ITO/Ag/ITO, but the inventive concepts are not limited thereto.

The pixel defining layer PDL may be disposed on the pixel electrode PXE. The pixel defining layer PDL may include an opening partially exposing the pixel electrode PXE. The pixel defining layer PDL may partially cover the pixel electrode PXE and the via layer 162.

The pixel defining layer PDL may be formed of an organic insulating material or an inorganic insulating material. For example, the pixel defining layer PDL may include at least one of polyimide resin, acrylic resin, a silicon compound, or polyacrylic resin.

The light emitting layer EML may be disposed on the pixel electrode PXE exposed by the pixel defining layer PDL. At least a part of the light emitting layer EML may be disposed in the opening of the pixel defining layer PDL. The light emitting layer EML may partially cover the top surface of the pixel defining layer PDL and the side surface of the pixel defining layer PDL forming an opening.

The light emitting layer EML may include an organic material layer. The organic material layer may include an organic light emitting layer, and may further include a hole injection/transport layer and an electron injection/transport layer.

The common electrode CME may be disposed on the light emitting layer EML. The common electrode CME may be extended across all the pixels PX. The common electrode CME may be a cathode electrode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). The common electrode CME may further include a transparent metal oxide layer disposed on the material layer having a low work function.

The pixel electrode PXE, the light emitting layer EML, and the common electrode CME may constitute a light emitting element EMD. The light emitting element EMD may be, for example, an organic light emitting element. In an embodiment, the wavelength of light emitted by the light emitting element EMD may be constant for each pixel PX. For example, the light emitting layer EML of each color pixel PX may emit blue light or ultraviolet rays, and the second display substrate 200 to be described later may include a wavelength conversion layer WCL, thereby displaying a different color for each pixel PX.

In another embodiment, the wavelength of light emitted by each light emitting layer EML may be different for each color pixel PX, and thus, a color of light emitted may be different. For example, the light emitting layer EML of the first color pixel PX may emit light of a first color, the light emitting layer EML of the second color pixel PX may emit light of a second color, and the light emitting layer EML of the third color pixel PX may emit light of a third color.

The thin film encapsulation layer 170 may be disposed on the common electrode CME. The thin film encapsulation layer 170 may include a first inorganic layer 171, a first organic layer 172 disposed on the first inorganic layer 171, and a second inorganic layer 173 disposed on the first organic layer 172. Although not shown, the first inorganic layer 171 and the second inorganic layer 173 may be in contact with each other at the end of the thin film encapsulation layer 170, so that the first organic layer 172 may be sealed by the first inorganic layer 171 and the second inorganic layer 173.

Each of the first inorganic layer 171 and the second inorganic layer 173 may include silicon nitride, silicon oxide, silicon oxynitride, or the like. The first organic layer 172 may include an organic insulating material.

The second display substrate 200 may be disposed above the thin film encapsulation layer 170 to face the first display substrate 100.

The second base substrate 210 of the second display substrate 200 may include a transparent insulating material such as glass. The second base substrate 210 may be a rigid substrate.

A light blocking member BML may be disposed on one surface of the second base substrate 210 facing the first base substrate 110 along the boundaries of the pixels PX. The light blocking member BML may overlap the pixel defining layer PDL of the first display substrate 100. The light blocking member BML may be formed in a lattice shape in plan view, and may include an opening exposing one surface of the second base substrate 210.

A color filter layer CFL may be disposed on one surface of the second base substrate 210 on which the light blocking member BML is disposed. The color filter layer CFL may be provided on one surface of the second substrate 210, which is exposed through the opening of the light blocking member BML.

The color filter layer CFL may include a colorant such as a dye or pigment that absorbs wavelengths other than the corresponding color wavelength. The color filter layer CFL may include colorants of different colors for each pixel PX. For example, the color filter layer CFL may include a red colorant, a green colorant, and a blue colorant.

A first capping layer 220 for preventing permeation of impurities, such as moisture or air, may be disposed on the color filter layer CFL.

A partition wall PTL may be disposed on the first capping layer 220. The partition wall PTL may be disposed to overlap the light blocking member BML. The partition wall PTL may include an opening exposing a region in which the color filter layer CFL is disposed.

The wavelength conversion layer WCL may be disposed in a space exposed by the opening of the partition wall PTL. The wavelength conversion layer WCL may be formed by an inkjet process using the partition wall PTL as a bank, but the inventive concepts are not limited thereto.

The wavelength conversion layer WCL may convert the wavelength of light incident from the light emitting layer EML. The wavelength conversion layer WCL may include a base resin BRS, and a scatterer SCPC, and a wavelength conversion material WCP disposed in the base resin BRS. The base resin BRS may include a transparent organic material. The wavelength conversion material WCP may be a quantum dot, a quantum rod, a phosphor, or the like. Examples of the quantum dot may include group IV nanocrystal, group II-VI compound nanocrystal, group III-V compound nanocrystal, group IV-VI nanocrystal, and a combination thereof.

In another embodiment, the wavelength conversion layer WCL may not include the wavelength conversion material WCP. When the wavelength conversion layer WCL does not include the wavelength conversion material WCP, it may serve as a light transmitting layer that transmits light.

A second capping layer 230 may be disposed on the wavelength conversion layer WCL and the partition wall PTL. That is, the second capping layer 230 may be entirely disposed in the second display substrate 200.

The filling layer 300 may be disposed between the first display substrate 100 and the second display substrate 200. The filling layer 300 may fill a space between the first display substrate 100 and the second display substrate 200, and may serve to bond them to each other. The filling layer 300 may be disposed between the thin film encapsulation layer 170 of the first display substrate 100 and the second capping layer 230 of the second display substrate 200. The filling layer 300 may be formed of an Si-based organic material, an epoxy-based organic material, or the like, but the inventive concepts are not limited thereto.

Hereinafter, the electrostatic protection circuit PC for protecting various signal lines of the display device 1 from a voltage of very high or low potential will be described.

Figure 5:
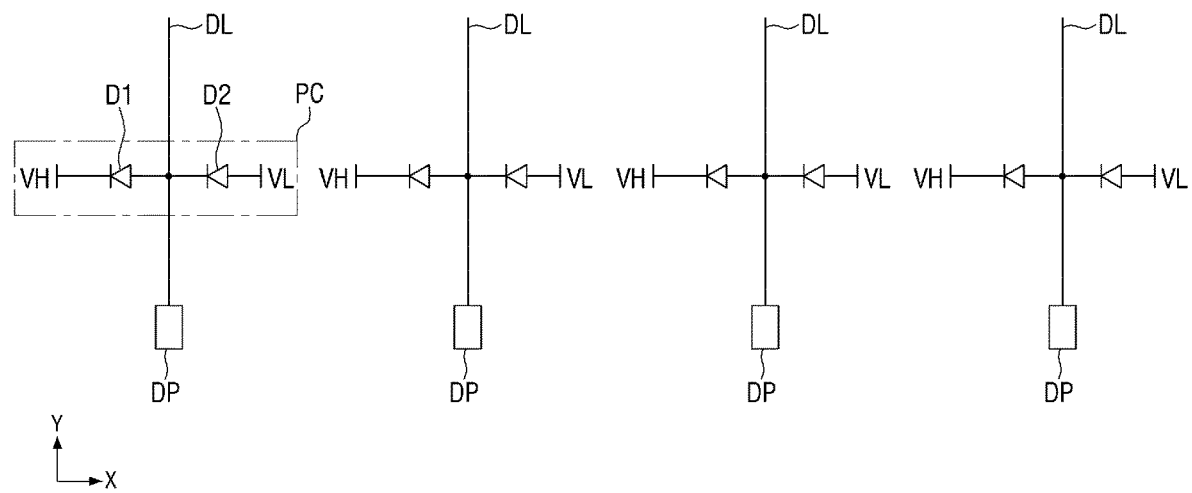
FIG. 5 is a partially enlarged view of the electrostatic protection circuit area of FIG. 2.
Figure 6:
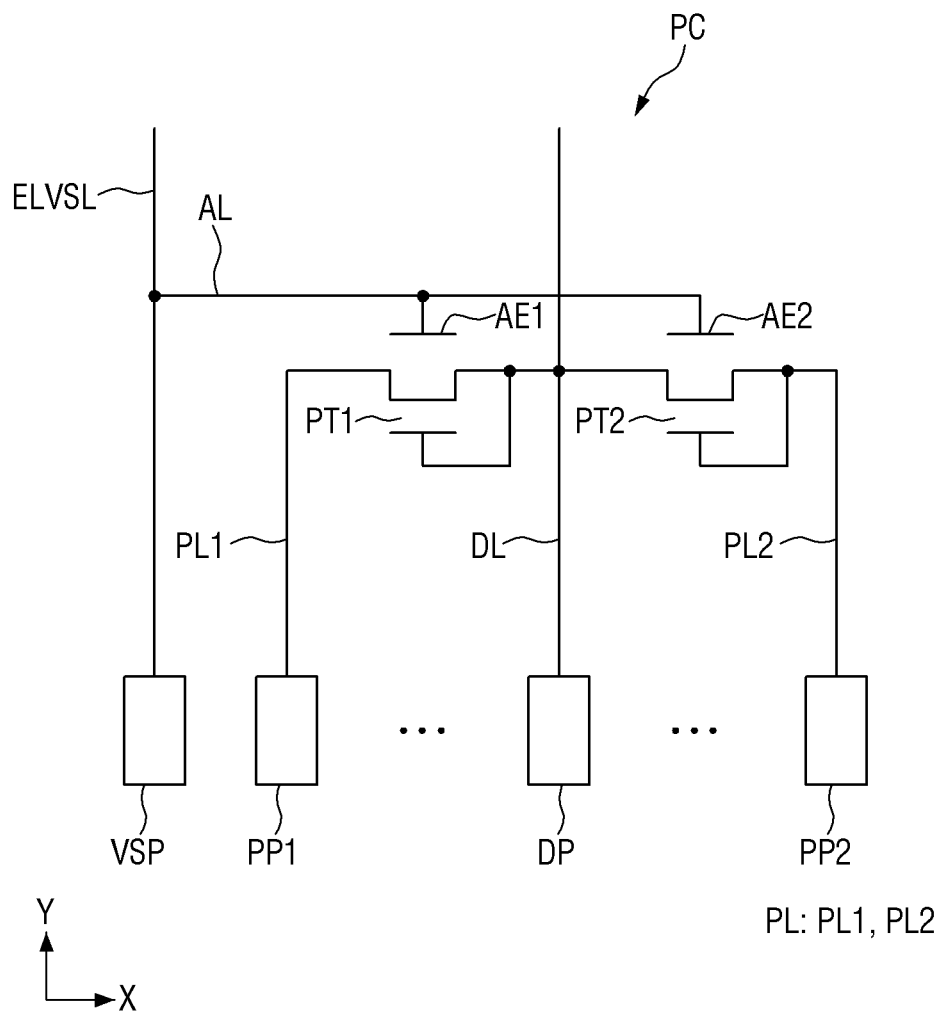
FIG. 6 is a schematic diagram of an electrostatic protection circuit of a display device according to an embodiment of the invention.
Figure 7:
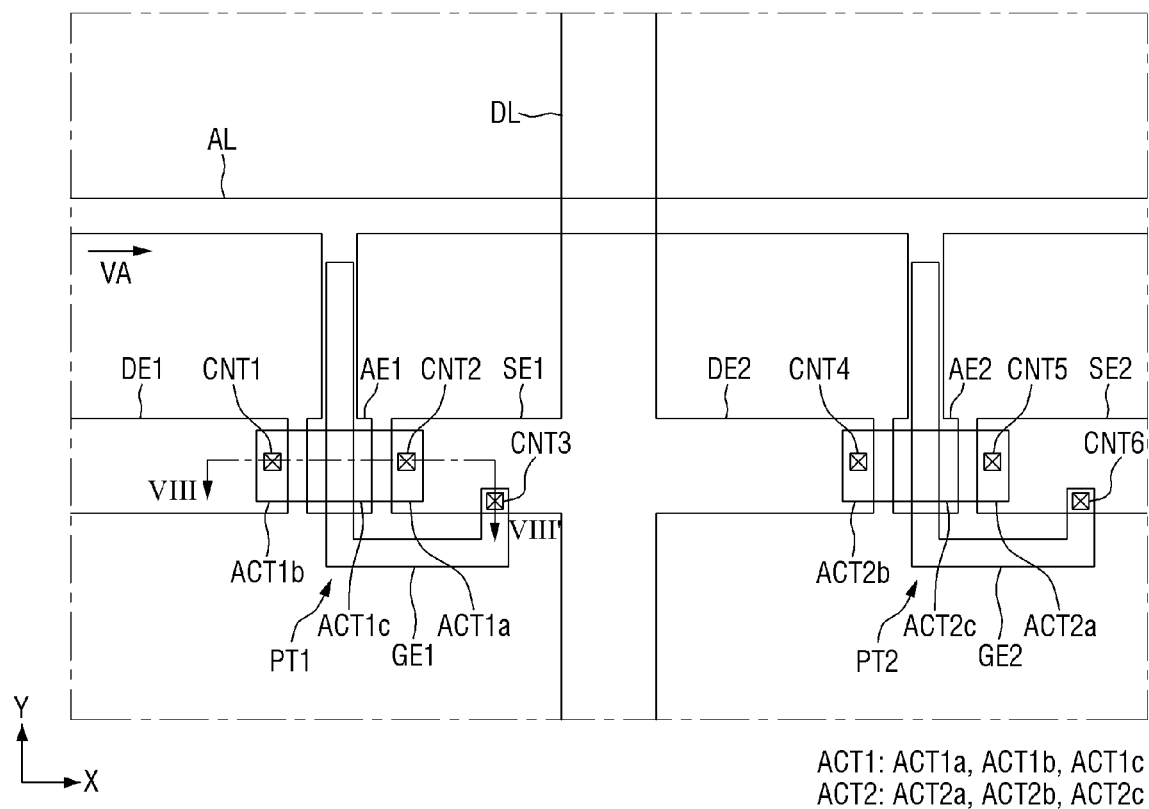
FIG. 7 is a layout diagram illustrating an example of a protection transistor included in a display device according to an embodiment of the invention.
Figure 8:
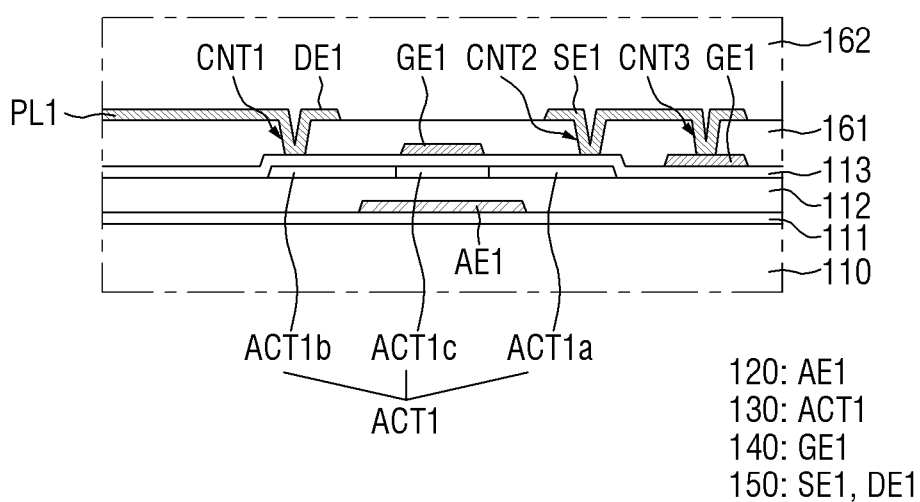
FIG. 8 is a cross-sectional view taken along line VIII-VIII' of FIG. 7.

FIG. 5 is a partially enlarged view of the electrostatic protection circuit area of FIG. 2. FIG. 6 is a schematic diagram of an electrostatic protection circuit of a display device according to an embodiment. FIG. 7 is a layout diagram illustrating an example of a protection transistor included in a display device according to one embodiment. FIG. 8 is a cross-sectional view taken along line VIII-VIII' of FIG. 7.

Referring to FIGS. 5 to 8 in conjunction with FIG. 2, the display device 1 according to an embodiment may include the electrostatic protection circuit PC. The electrostatic protection circuit PC may be disposed in the non-display area NDA of the display device 1. When a pulse voltage of very high or low potential is inputted to the display device 1 from the outside due to, for example, static electricity or the like, elements constituting the internal circuit of the display device 1 may be damaged. When a pulse voltage of very high or low potential is inputted, the electrostatic protection circuit PC may prevent damage to elements connected to the corresponding electrostatic protection circuit PC.

The electrostatic protection circuit PC may be connected to various signal lines of the display device 1. Hereinafter, it is exemplarily described that the electrostatic protection circuit PC is connected to the data line DL, but the inventive concepts are not limited thereto, and the electrostatic protection circuit PC may be connected to other lines, such as the scan control line SCL and the first and second power lines ELVDL and ELVSL.

In an embodiment, the electrostatic protection circuit PC may be disposed for each data line DL. The electrostatic protection circuit PC may include a first diode D1 disposed to one side of the data line DL and a second diode D2 disposed to the other side of the data line DL so that the data line DL is interposed therebetween. In FIG. 5, one first diode D1 and one second diode D2 are shown, but a plurality of the first diodes D1 and a plurality of the second diodes D2 may be provided. The first and second diodes D1 and D2 may be formed of thin film transistors. A detailed description thereof will be made later.

The data line DL may be connected to the input terminal of the first diode D1, and a first driving voltage VH having a relatively high potential may be applied to the output terminal of the first diode D1. A second driving voltage VL having a relatively lower potential than the first driving voltage VH is applied to the input terminal of the second diode D2, and the data line DL may be connected to the output terminal of the second diode D2. The first driving voltage VH may have a value greater than the maximum potential of a signal applied to the data line DL, and the second driving voltage VL may have a value less than the minimum potential of the signal applied to the data line DL.

A state in which a pulse potential in a normal range (specifically, a range smaller than the sum of the first driving voltage VH and the threshold voltage of the first diode D1 and greater than a value obtained by subtracting the threshold voltage of the second diode D2 from the second driving voltage VL) is provided from the display pad DP to the data line DL may indicate that the first and second diodes D1 and D2 are in reverse-biased states, which corresponds to turn-off states. Accordingly, the data line DL may be in an insulated state with respect to the first driving voltage VH and the second driving voltage VL, and the first driving voltage VH and the second driving voltage VL may not affect the signal transmitted through the data line DL.

As one example, when a voltage of very high potential (specifically, a potential equal to or greater than the sum of the first driving voltage VH and the threshold voltage of the first diode D1) is instantaneously applied to the data line DL, the first diode D1 is turned on, so that a current may flow from the data line DL to the first diode D1. Accordingly, it is possible to prevent a voltage of very high potential from being applied to the internal circuit of the display device 1. In this case, the second diode D2 is in a turn-off state, and the data line DL and the second driving voltage VL may keep insulated from each other.

As another example, when a voltage of very low potential (specifically, a potential equal to or less than a value obtained by subtracting the threshold voltage of the second diode D2 from the second driving voltage VL) is instantaneously applied to the data line DL, the second diode D2 is turned on, so that a current may flow from the data line DL to the second diode D2. Accordingly, it is possible to prevent a voltage of very low potential from being applied to the internal circuit of the display device 1. In this case, the first diode D1 is in a turn-off state, and the data line DL and the first driving voltage VH may keep insulated from each other.

Accordingly, the electrostatic protection circuit PC may prevent a voltage of very high or low potential from being applied to the internal circuit of the display device 1. That is, the electrostatic protection circuit PC may suppress a sudden change in potential of the data line DL due to static electricity, and may protect the internal circuit of the display device 1.

Hereinafter, a specific structure of the electrostatic protection circuit PC will be described.

The first diode D1 may be formed of a first transistor PT1, and the second diode D2 may be formed of a second transistor PT2. The first and second transistors PT1 and PT2 may be N-type transistors, but are not limited thereto, and may be P-type transistors. Hereinafter, the first and second transistors PT1 and PT2 are described as being, for example, N-type transistors, but are not limited thereto.

The driving voltage line PL may include a first driving voltage line PL1 connected to the first protection pad PP1 and a second driving voltage line PL2 connected to the second protection pad PP2. The first driving voltage line PL1 may be connected to the first transistor PT1, and the second driving voltage line PL2 may be connected to the second transistor PT2.

The first transistor PT1 may be disposed between the data line DL and the first driving voltage line PL1. Specifically, a first protection source/drain electrode SE1 of the first transistor PT1 may be connected to the data line DL. A second protection source/drain electrode DE1 of the first transistor PT1 may be connected to the first driving voltage line PL1 to which the first driving voltage VH is applied. A first upper gate electrode GE1 of the first transistor PT1 may be connected to the first protection source/drain electrode SE1 and the data line DL. The first protection source/drain electrode SE1 may be a source electrode of the first transistor PT1, and the second protection source/drain electrode DE1 may be a drain electrode of the first transistor PT1, but they are not limited thereto and may be arranged in reverse.

In a region where the first transistor PT1 is disposed, the display device 1 may include the base substrate 110, the barrier layer 111 disposed on the base substrate 110, a first lower gate electrode AE1 disposed on the barrier layer 111, the buffer layer 112 disposed on the first lower gate electrode AE1, a first active layer ACT1 disposed on the buffer layer 112, the gate insulating layer 113 disposed on the first active layer ACT1 and the buffer layer 112, the first upper gate electrode GE1 disposed on the gate insulating layer 113, the interlayer insulating layer 161 disposed on the first upper gate electrode GE1, the first and second protection source/drain electrodes SE1 and DE1 disposed on the interlayer insulating layer 161, and the via layer 162 disposed on the first and second protection source/drain electrodes SE1 and DE1. A structure stacked only up to the via layer 162 is shown in FIG. 8, but another insulating layer may be further disposed on the via layer 162.

The first lower gate electrode AE1 may be disposed on the same layer as the first conductive layer 120 described above with reference to FIG. 4. A predetermined voltage may be applied to the first lower gate electrode AE1 to increase the threshold voltage of the first transistor PT1. A description thereof will be given later. The first lower gate electrode AE1 may be connected to the power auxiliary line AL. For example, the first lower gate electrode AE1 may extend from the power auxiliary line AL to the other side of the second direction Y to be terminated, but is not limited thereto. The end of the first lower gate electrode AE1 may have a width greater than that of other regions. The first lower gate electrode AE1 may partially overlap the first upper gate electrode GE1 to be described later.

The first active layer ACT1 may include a first protection channel region ACT1c, a first protection source/drain region ACT1a disposed to one side of the first protection channel region ACT1c, and a second protection source/drain region ACT1b disposed to the other side of the first protection channel region ACT1c.

The first protection channel region ACT1c may partially overlap the first lower gate electrode AE1 and the first upper gate electrode GE1 to be described later. The first protection source/drain region ACT1a may overlap the first protection source/drain electrode SE1 to be described later. The second protection source/drain region ACT1b may overlap the second protection source/drain electrode DE1 to be described later.

The first upper gate electrode GE1 of the first transistor PT1 may be disposed on the same layer as the second conductive layer 140 described above with reference to FIG. 4. As described above, the first upper gate electrode GE1 of the first transistor PT1 may partially overlap the first lower gate electrode AE1, and may partially overlap the first protection channel region ACT1c and the first protection source/drain electrode SE1.

The first upper gate electrode GE1 may extend in the second direction Y in a region overlapping the first lower gate electrode AE1, and be bent at the other end of the second direction Y to extend to one side of the first direction X. Then, it may be bent at one end of the first direction X to one side of the second direction Y to partially overlap the first protection source/drain electrode SE1.

The first and second protection source/drain electrodes SE1 and DE1 of the first transistor PT1 may be disposed on the same layer as the third conductive layer 150 described above with reference to FIG. 4. The first and second protection source/drain electrodes SE1 and DE1 may be disposed opposite each other in the first direction X. In plan view, the first lower gate electrode AE1, the first protection channel region ACT1c, and the first upper gate electrode GE1 may be disposed between the first and second protection source/drain electrodes SE1 and DE1.

The first protection source/drain electrode SE1 may be connected to the first protection source/drain region ACT1a through a second contact hole CNT2 penetrating the interlayer insulating layer 161. The first protection source/drain electrode SE1 may be connected to the first upper gate electrode GE1 through a third contact hole CNT3 penetrating the interlayer insulating layer 161. The second protection source/drain electrode DE1 may be connected to the second protection source/drain region ACT1b through a first contact hole CNT1 penetrating the interlayer insulating layer 161.

The second transistor PT2 may be disposed between the data line DL and the second driving voltage line PL2. Specifically, a third protection source/drain electrode SE2 of the second transistor PT2 may be connected to the second driving voltage line PL2 to which the second driving voltage VL having a lower potential than the first driving voltage VH is applied. A fourth protection source/drain electrode DE2 of the second transistor PT2 may be connected to the data line DL. A second upper gate electrode GE2 of the second transistor PT2 may be connected to the third protection source/drain electrode SE2 and the second driving voltage line PL2. The third protection source/drain electrode SE2 may be a source electrode of the second transistor PT2, and the fourth protection source/drain electrode DE2 may be a drain electrode of the second transistor PT2, but they are not limited thereto and may be arranged in reverse.

In a region where the second transistor PT2 is disposed, a stacked structure of the display device 1 may be substantially the same as that in the region where the first transistor PT1 is disposed. Specifically, in the region where the second transistor PT2 is disposed, the display device 1 may include the base substrate 110, the barrier layer 111 disposed on the base substrate 110, and a second lower gate electrode AE2 disposed on the barrier layer 111, the buffer layer 112 disposed on the second lower gate electrode AE2, a second active layer ACT2 disposed on the buffer layer 112, the gate insulating layer 113 disposed on the second active layer ACT2 and the buffer layer 112, the second upper gate electrode GE2 disposed on the gate insulating layer 113, the interlayer insulating layer 161 disposed on the second upper gate electrode GE2, the third and fourth protection source/drain electrodes SE2 and DE2 disposed on the interlayer insulating layer 161, and the via layer 162 disposed on the third and fourth protection source/drain electrodes SE2 and DE2.

The second lower gate electrode AE2 may be disposed on the same layer as the first conductive layer 120 described above with reference to FIG. 4. A predetermined voltage may be applied to the second lower gate electrode AE2 to increase the threshold voltage of the second transistor PT2. A description thereof will be given later. The second lower gate electrode AE2 may be connected to the power auxiliary line AL. For example, the second lower gate electrode AE2 may extend from the power auxiliary line AL to the other side of the second direction Y to be terminated, but is not limited thereto. The end of the second lower gate electrode AE2 may have a width greater than that of other regions. The second lower gate electrode AE2 may partially overlap the second upper gate electrode GE2 to be described later.

The second active layer ACT2 may include a second protection channel region ACT2c, a third protection source/drain region ACT2a disposed to one side of the second protection channel region ACT2c, and a fourth protection source/drain region ACT2b disposed to the other side of the second protection channel region ACT2c.

The second protection channel region ACT2c may partially overlap the second lower gate electrode AE2 and the second upper gate electrode GE2 to be described later. The third protection source/drain region ACT2a may overlap the third protection source/drain electrode SE2 to be described later. The fourth protection source/drain region ACT2b may overlap the fourth protection source/drain electrode DE2 to be described later.

The second upper gate electrode GE2 of the second transistor PT2 may be disposed on the same layer as the second conductive layer 140 described above with reference to FIG. 4. As described above, the second upper gate electrode GE2 of the second transistor PT2 may partially overlap the second lower gate electrode AE2, and may partially overlap the second protection channel region ACT2c and the third protection source/drain electrode SE2.

The second upper gate electrode GE2 may extend in the second direction Y in a region overlapping the second lower gate electrode AE2, and be bent at the other end of the second direction Y to extend to one side of the first direction X. Then, it may be bent at one end of the first direction X to one side of the second direction Y to partially overlap the third protection source/drain electrode SE2.

The third and fourth protection source/drain electrodes SE2 and DE2 of the second transistor PT2 may be disposed on the same layer as the third conductive layer 150 described above with reference to FIG. 4. The third and fourth protection source/drain electrodes SE2 and DE2 may be disposed opposite each other in the first direction X. In plan view, the second lower gate electrode AE2, the second protection channel region ACT2c, and the second upper gate electrode GE2 may be disposed between the third and fourth protection source/drain electrodes SE2 and DE2.

The third protection source/drain electrode SE2 may be connected to the third protection source/drain region ACT2a through a fifth contact hole CNT5 penetrating the interlayer insulating layer 161. The third protection source/drain electrode SE2 may be connected to the second upper gate electrode GE2 through a sixth contact hole CNT6 penetrating the interlayer insulating layer 161. The fourth protection source/drain electrode DE2 may be connected to the fourth protection source/drain region ACT2b through a fourth contact hole CNT4 penetrating the interlayer insulating layer 161.

An auxiliary voltage VA (see FIG. 7) of substantially the same magnitude may be applied to the first lower gate electrode AE1 of the first transistor PT1 and the second lower gate electrode AE2 of the second transistor PT2 through auxiliary power line AL. The auxiliary voltage VA may have substantially the same potential as the second source voltage provided from the second power pad VSP and applied through the second power line ELVSL. The second source voltage may be a voltage lower than 0V. The auxiliary voltage VA may be applied to the lower gate electrodes AE1 and AE2 of the first and second transistor PT1 and PT2 to increase the threshold voltage of each of the protection transistors PT1 and PT2. When the first and second transistors PT1 and PT2 are N-type transistors, the auxiliary voltage VA may have a potential lower than 0V, but the inventive concepts are not limited thereto. When the first and second transistors PT1 and PT2 are P-type transistors, the auxiliary voltage VA may have a potential higher than 0V. Hereinafter, a relationship between the auxiliary voltage VA and the threshold voltage of the first and second transistors PT1 and PT2 will be described with reference to FIGS. 9 and 10.

Figure 9:
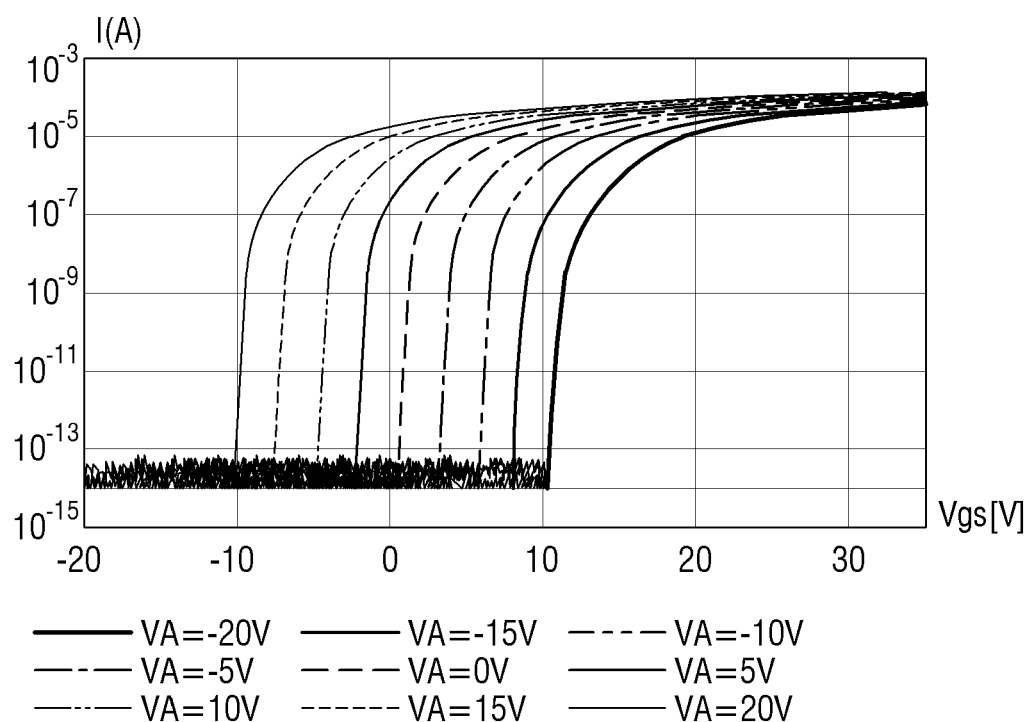
FIG. 9 is a graph showing a current according to a gate voltage applied to a protection transistor by magnitude of an auxiliary voltage.
Figure 10:
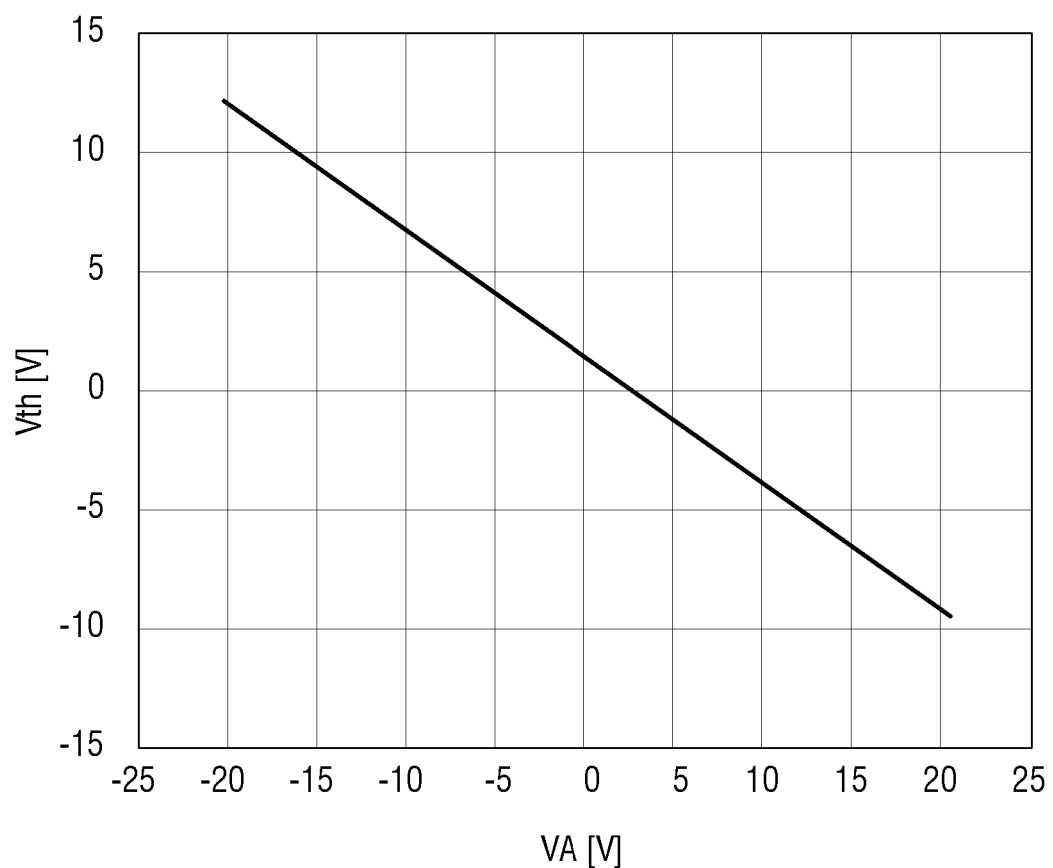
FIG. 10 is a graph showing a threshold voltage of a protection transistor according to an auxiliary voltage.

FIG. 9 is a graph showing a current according to a gate voltage applied to a protection transistor by magnitude of an auxiliary voltage VA. FIG. 10 is a graph showing a threshold voltage of a protection transistor according to an auxiliary voltage VA.

Referring to FIGS. 9 and 10, it may be seen that as the auxiliary voltage VA decreases, a threshold voltage Vth of the protection transistors PT1 and PT2 tends to increase.

Specifically, in a case where the auxiliary voltage VA is 20V, the current starts to flow when a gate voltage Vgs becomes about −9V or more. In a case where the auxiliary voltage VA is 15V, the current starts to flow when the gate voltage Vgs becomes about −7V or more. In a case where the auxiliary voltage VA is 10V, the current starts to flow when the gate voltage Vgs becomes about −4V or more. In a case where the auxiliary voltage VA is 5V, the current starts to flow when the gate voltage Vgs becomes about −2V or more. In a case where the auxiliary voltage VA is 0V, the current starts to flow when the gate voltage Vgs becomes about 2V or more. In a case where the auxiliary voltage VA is −5V, the current starts to flow when the gate voltage Vgs becomes about 4V or more. In a case where the auxiliary voltage VA is −10V, the current starts to flow when the gate voltage Vgs becomes about 7V or more. In a case where the auxiliary voltage VA is −15V, the current starts to flow when the gate voltage Vgs becomes about 9V or more. In a case where the auxiliary voltage VA is −20V, the current starts to flow when the gate voltage Vgs becomes about 12V or more.

When the auxiliary voltage VA applied to the first and second transistors PT1 and PT2 is decreased, the threshold voltage of the first and second transistors PT1 and PT2 may increase, thereby reducing a leakage current flowing through the first and second transistors PT1 and PT2. In order to increase the threshold voltage, it may be desirable that the auxiliary voltage VA applied to the first and second transistors PT1 and PT2 has a negative potential.

Figure 11:
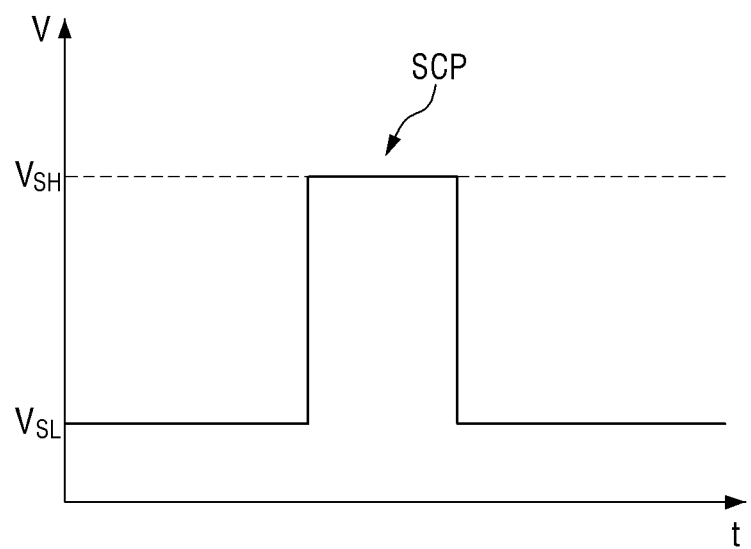
FIG. 11 is a graph illustrating a scan signal applied to a display device according to an embodiment of the invention.

FIG. 11 is a graph illustrating a scan signal applied to a display device according to an embodiment.

Referring to FIG. 11, a scan signal applied to the scan line SL of the display device 1 may have a form of a scan pulse SCP that swings (i.e., alternately appears with a constant period) from a first scan voltage VSH to a second scan voltage VSL lower than the first scan voltage VSH. In an embodiment, the first driving voltage VH and the second driving voltage VL used in the electrostatic protection circuit PC may be the same as the first scan voltage VSH and the second scan voltage VSL of the scan signal, respectively. Specifically, the first scan voltage VSH may be applied as the first driving voltage VH, and the second scan voltage VSL may be applied as the second driving voltage VL.

The display device 1 according to an embodiment may include the protection circuit PC for protecting the internal circuit of the display device 1. The protection circuit PC may include the first diode D1 in the form of the first transistor PT1 disposed to one side of the data line DL and the second diode D2 in the form of the second transistor PT2 disposed to the other side of the data line DL so that the data line DL is interposed therebetween. By applying the auxiliary voltage VA having a negative potential to the power auxiliary line AL connected to the lower gate electrodes AE1 and AE2 of the first and second transistors PT1 and PT2, the threshold voltage Vth of the first and second transistors PT1 and PT2 may be increased, thereby reducing a leakage current flowing through the first and second transistors PT1 and PT2. Resultantly, noise that may occur in the display device 1 may be reduced, thereby improving the reliability of the display device 1.

Hereinafter, another embodiment of the display device 1 will be described. In the following description of the display device 1 according to another embodiment, redundant parts of the description of the display device 1 according to one embodiment will be omitted, and differences will be mainly described.

Figure 12:
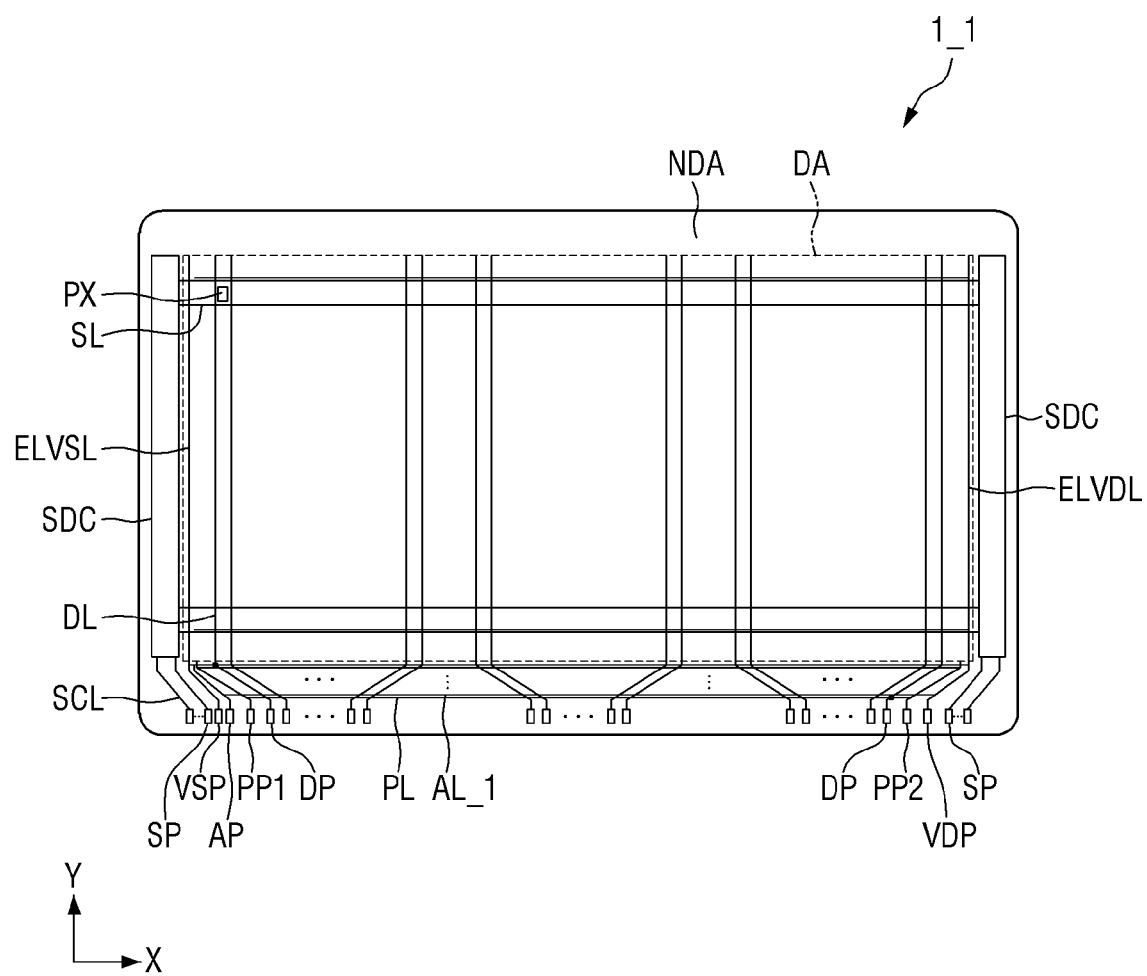
FIG. 12 is a layout diagram illustrating one example of a display panel of a display device according to another embodiment of the invention.
Figure 13:
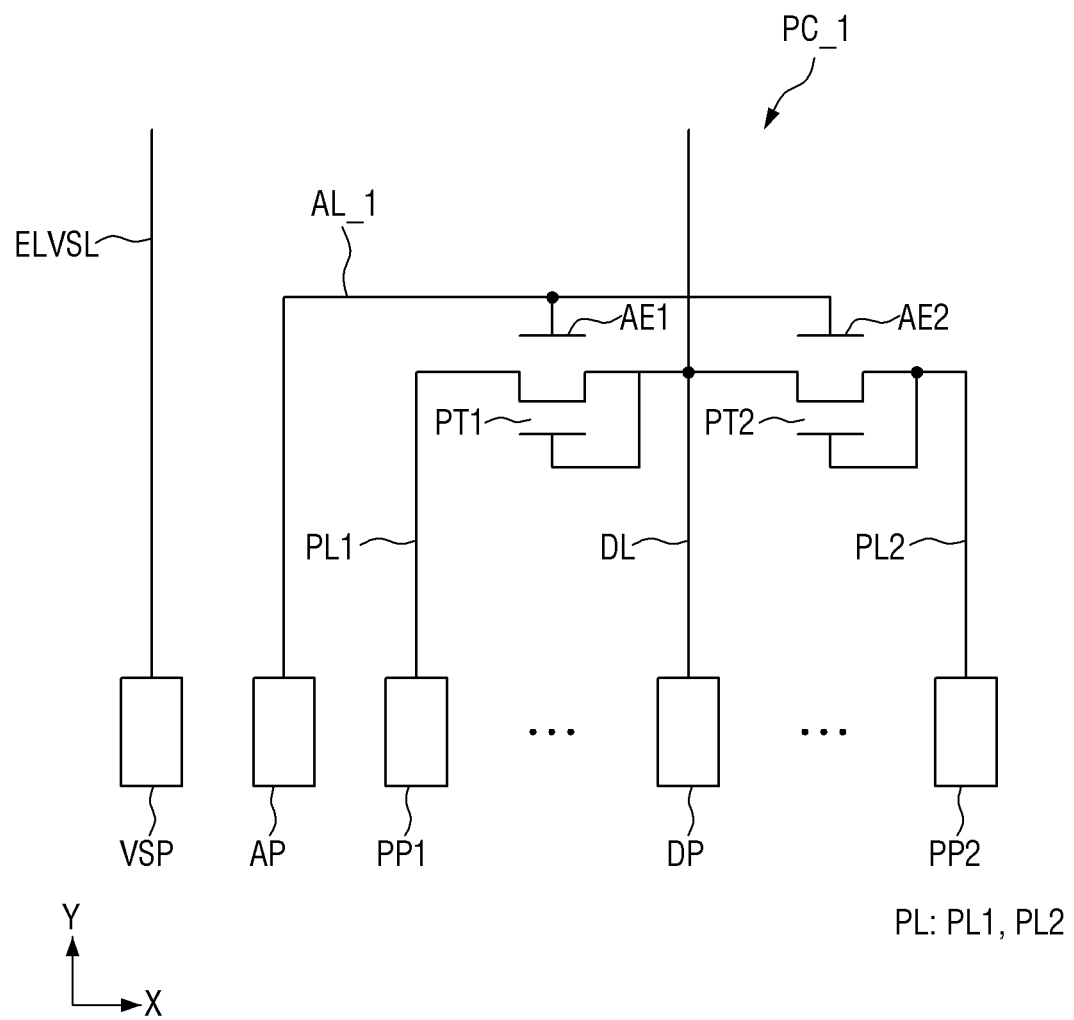
FIG. 13 is a schematic diagram of an electrostatic protection circuit of the display device according to the embodiment of FIG. 12.

FIG. 12 is a layout diagram illustrating one example of a display panel of a display device according to another embodiment. FIG. 13 is a schematic diagram of an electrostatic protection circuit of the display device according to the embodiment of FIG. 12.

A display device 1_1 according to the present embodiment is different from the display device 1 according to the previous embodiment in that it further includes a separate auxiliary pad AP. In the present embodiment, the second power line ELVSL extending from the second power pad VSP may not be connected to an auxiliary line AL_1.

The display device 1_1 according to the present embodiment may include the auxiliary pad AP connected to the auxiliary line AL_1. In the present embodiment, the auxiliary pad AP may be disposed between the second power pad VSP and the first protection pad PP1, but is not limited thereto. The auxiliary voltage VA may be applied to the auxiliary pad AP. The auxiliary voltage VA applied to the auxiliary pad AP may have a negative potential.

The display device 1_1 according to the present embodiment may include the protection circuit PC_1 for protecting the internal circuit of the display device 1_1. The protection circuit PC_1 may include the first diode D1 in the form of the first transistor PT1 disposed to one side of the data line DL and the second diode D2 in the form of the second transistor PT2 disposed to the other side of the data line DL so that the data line DL is interposed therebetween. By applying the auxiliary voltage VA having a negative potential to the auxiliary line AL_1 connected to the lower gate electrodes AE1 and AE2 of the first and second transistors PT1 and PT2, the threshold voltage Vth of the first and second transistors PT1 and PT2 may be increased, thereby reducing a leakage current flowing through the first and second transistors PT1 and PT2. As a result, noise that may occur in the display device 1_1 may be reduced, thereby improving the reliability of the display device 1_1.

Further, the display device 1_1 according to the present embodiment may include the separate auxiliary pad AP to variously adjust the magnitude of the auxiliary voltage VA applied to the auxiliary line AL_1.

The display device according to the inventive concepts may include, as an electrostatic protection circuit of a signal line, a plurality of transistors connected to the signal line. Each transistor may include a lower gate electrode, and an auxiliary voltage is applied to each lower gate electrode to increase a threshold voltage of each transistor, thereby reducing a leakage current. In addition, noise generated in the display device may be reduced, thereby improving the reliability of the display device.

It will be apparent to those skilled in the art that various modifications and variations can be made to the disclosed embodiments without substantially departing from the spirit and scope of the inventive concepts. Thus, it is intended that the inventive concepts cover the modifications and variations of the disclosed embodiments provided they come within the scope of the appended claims and their equivalents.

What is claimed is:

1. A display device comprising:
    a substrate;
    a signal line disposed on a surface of the substrate and configured to receive a predetermined voltage signal;
    a power auxiliary line configured to receive a first source voltage;
    a first driving voltage line configured to receive a first driving voltage greater than the first source voltage;
    a first transistor disposed between the signal line and the first driving voltage line, the first transistor including:
        a first lower gate electrode electrically connected to the power auxiliary line; and
        a first upper gate electrode electrically connected to the signal line; and
    an insulating layer covering the first upper gate electrode, wherein
    the insulating layer is disposed between the signal line and the power auxiliary line in a third direction extending perpendicular to the surface of the substrate,
    the first transistor further includes:
        an active layer disposed between the first upper gate electrode and the first lower gate electrode in the third direction, the active layer including a first region, a second region, and a channel region between the first region and the second region;
        a first electrode extending from the first driving voltage line and electrically connected to the first region through a first contact hole in the insulating layer; and
        a second electrode extending from the signal line and electrically connected to the second region through a second contact hole in the insulating layer, and
    the insulating layer includes a third contact hole through which the second electrode and the first upper gate electrode are electrically connected to each other.

2. The display device of claim 1, wherein the first source voltage is a voltage lower than 0V.

3. The display device of claim 2, wherein the first transistor is an N-type transistor.

4. The display device of claim 1, wherein the first transistor further includes:
    a drain electrode electrically connected to the first driving voltage line; and
    a source electrode electrically connected to the signal line.

5. The display device of claim 1, further comprising:
    a second driving voltage line configured to receive a second driving voltage lower than the first driving voltage; and
    a second transistor disposed between the signal line and the second driving voltage line,
    wherein the second transistor includes:
        a second lower gate electrode electrically connected to the power auxiliary line; and
        a second upper gate electrode electrically connected to the second driving voltage line.

6. The display device of claim 5, wherein the first source voltage is a voltage lower than 0V.

7. The display device of claim 6, wherein the first transistor and the second transistor are N-type transistors.

8. The display device of claim 5, wherein the second transistor further includes:
    a drain electrode electrically connected to the signal line; and
    a source electrode electrically connected to the second driving voltage line.

9. The display device of claim 5, wherein the signal line is configured to receive a data signal having a potential between a maximum voltage and a minimum voltage, and
    the first driving voltage is greater than the maximum voltage, and the second driving voltage is smaller than the minimum voltage.

10. The display device of claim 5, further comprising a scan line disposed on the substrate and configured to receive a scan signal swinging from the first driving voltage to the second driving voltage.

11. The display device of claim 1, wherein the power auxiliary line is electrically connected to a first power line electrically connected to a first power pad.

12. The display device of claim 11, further comprising:
    a pixel electrode disposed on the substrate;
    a light emitting layer disposed on the pixel electrode; and
    a common electrode disposed on the light emitting layer,
    wherein the first power line is electrically connected to the common electrode.

13. The display device of claim 1, wherein
    the power auxiliary line extends in a first direction,
    the signal line extends in a second direction transverse to the first direction,
    the power auxiliary line and the signal line overlap one another in the third direction, and
    the third direction is perpendicular to both the first direction and the second direction.

14. A display device comprising:
    a substrate;
    a signal line disposed on a surface of the substrate and configured to receive a predetermined voltage signal;
    a first driving voltage line configured to receive a first driving voltage;
    a second driving voltage line configured to receive a second driving voltage lower than the first driving voltage;
    a first transistor disposed between the signal line and the first driving voltage line and including a first lower gate electrode and a first upper gate electrode;

a second transistor disposed between the signal line and the second driving voltage line and including a second lower gate electrode and a second upper gate electrode;

an insulating layer covering both the first upper gate electrode and the second upper gate electrode;

a pixel electrode disposed on the substrate;

a light emitting layer disposed on the pixel electrode; and a common electrode disposed on the light emitting layer, wherein the first lower gate electrode and the second lower gate electrode are configured to receive a same voltage from a first power line, the first power line is electrically connected to the common electrode the insulating layer is disposed between the signal line and the first power line in a direction extending perpendicular to the surface of the substrate, the first transistor further includes:
- an active layer disposed between the first upper gate electrode and the first lower gate electrode in the direction, the active layer including a first region, a second region, and a channel region between the first region and the second region;
- a first electrode extending from the first driving voltage line and electrically connected to the first region through a first contact hole in the insulating layer; and
- a second electrode extending from the signal line and electrically connected to the second region through a second contact hole in the insulating layer, and the second electrode is electrically connected to the first upper gate electrode through a third contact hole in the insulating layer.

15. The display device of claim 14, wherein the first power line is configured to receive a first source voltage lower than the first driving voltage, and the first power line is electrically connected to the second driving voltage line.

16. The display device of claim 15, wherein the first source voltage is a voltage lower than 0V.

17. The display device of claim 16, wherein the first transistor and the second transistor are N-type transistors.

18. The display device of claim 15, wherein the first source voltage is a voltage higher than 0V, and the first transistor and the second transistor are P-type transistors.

19. The display device of claim 14, wherein the first upper gate electrode is electrically connected to the signal line.

20. The display device of claim 14, wherein the second upper gate electrode is electrically connected to the second driving voltage line.

* * * * *